(12) United States Patent
Kobayashi et al.

(10) Patent No.: US 12,353,173 B2
(45) Date of Patent: Jul. 8, 2025

(54) WATCH

(71) Applicant: SEIKO EPSON CORPORATION, Tokyo (JP)

(72) Inventors: Atsushi Kobayashi, Shiojiri (JP); Shoki Mukaide, Shiojiri (JP); Kentaro Hara, Azumino (JP)

(73) Assignee: SEIKO EPSON CORPORATION (JP)

( * ) Notice: Subject to any disclaimer, the term of this patent is extended or adjusted under 35 U.S.C. 154(b) by 243 days.

(21) Appl. No.: 17/945,211

(22) Filed: Sep. 15, 2022

(65) Prior Publication Data

US 2023/0078118 A1    Mar. 16, 2023

(30) Foreign Application Priority Data

Sep. 16, 2021 (JP) ................. 2021-150956

(51) Int. Cl.
*G04B 43/00* (2006.01)
*G04B 37/00* (2006.01)
*H05K 9/00* (2006.01)

(52) U.S. Cl.
CPC ......... *G04B 43/00* (2013.01); *G04B 37/0008* (2013.01); *H05K 9/0007* (2013.01); *H05K 9/0067* (2013.01)

(58) Field of Classification Search
CPC .................. G04B 43/00; G02B 1/16
See application file for complete search history.

(56) References Cited

U.S. PATENT DOCUMENTS

| | | | | |
|---|---|---|---|---|
| 6,521,822 B2 * | 2/2003 | Ito | ........... | H01L 31/048 368/80 |
| 9,195,221 B2 * | 11/2015 | Oshita | ........... | G04G 17/04 |
| 2002/0157700 A1 | 10/2002 | Ito et al. | | |
| 2006/0164921 A1 * | 7/2006 | Gunnarsson | ........... | G04R 60/12 368/281 |
| 2008/0293373 A1 * | 11/2008 | Yasuoka | ........... | G04R 60/12 455/347 |
| 2015/0268640 A1 * | 9/2015 | Oshita | ........... | G04G 21/04 368/280 |
| 2016/0154146 A1 * | 6/2016 | Furusato | ........... | G04B 39/006 423/598 |
| 2017/0205538 A1 * | 7/2017 | Furusato | ........... | G04C 10/02 |
| 2019/0243309 A1 * | 8/2019 | Mukaiyama | ........... | G04B 43/00 |
| 2020/0293000 A1 * | 9/2020 | Shimoda | ........... | G04C 3/101 |

FOREIGN PATENT DOCUMENTS

| | | |
|---|---|---|
| JP | H03-071089 A | 3/1991 |
| JP | H09-230065 A | 9/1997 |
| JP | H11-109055 A | 4/1999 |
| JP | 2002-107469 A | 4/2002 |
| JP | 2008-128796 A | 6/2008 |

* cited by examiner

*Primary Examiner* — Edwin A. Leon
*Assistant Examiner* — Jason M Collins
(74) *Attorney, Agent, or Firm* — Harness, Dickey & Pierce, P.L.C.

(57) ABSTRACT

A watch includes a dial including, in plan view, a central portion having a non-conductive surface, and an outer peripheral portion provided at an outer periphery of the central portion and having a conductive surface, and a case electrically coupled to the outer peripheral portion and electrically coupled to a case back.

10 Claims, 16 Drawing Sheets

WATCH

The present application is based on, and claims priority from JP Application Serial Number 2021-150956, filed Sep. 16, 2021, the disclosure of which is hereby incorporated by reference herein in its entirety.

BACKGROUND

1. Technical Field

The present disclosure relates to a watch.

2. Related Art

When a wristwatch is worn, static electricity may propagate from an outside to a dial. There is a possibility that when the static electricity is charged to a circuit block, an integrated circuit may be destroyed. The static electricity in the dial needs to be removed to the outside of the watch not via the circuit block. A watch having structure in which static electricity in a dial is caused to flow to a case back is disclosed in JP 9-230065 A. According to the disclosure, a through-hole is provided in each of a main plate, a housing, and a printed wired board, that passes through in a thickness direction of the main plate. A coil spring is installed in the through-hole. The coil spring couples the dial and the case back to bring into a state of being electrically coupled. The static electricity in the dial flowed through the coil spring to the case back.

A multi-functional wristwatch has many parts that are stored inside a case. For this reason, a case becomes large, which makes it difficult for a person with a thin arm to wear the wristwatch. Even a non-multi-functional wristwatch is required to be small. When a wristwatch is made small, volume of parts occupying an interior of a case needs to be reduced.

In the watch of JP 9-230065 A, the coil spring through which static electricity flows is disposed inside the case. It is necessary to ensure volume occupied by the coil spring inside the case. When a wristwatch is made small, or multi-functional, volume of a part that electrically couples a dial and a case back is demanded to be reduced. Structure was desired for a watch that has static electricity resistance and in which volume occupied by a coil spring inside a case can be reduced.

SUMMARY

A watch includes a dial including, in plan view, a central portion having a non-conductive surface, and an outer peripheral portion provided at an outer periphery of the central portion and having a conductive surface, and a case electrically coupled to the outer peripheral portion and electrically coupled to a case back.

In the watch, static electricity entering the dial passes through the case electrically coupled to the outer peripheral portion of the dial, and flows to the case back.

DESCRIPTION OF EXEMPLARY EMBODIMENTS

First Exemplary Embodiment

In the present exemplary embodiment, a characteristic example of a watch will be described. A watch according to the first exemplary embodiment will be described in accordance with the figures.

Figure 1:
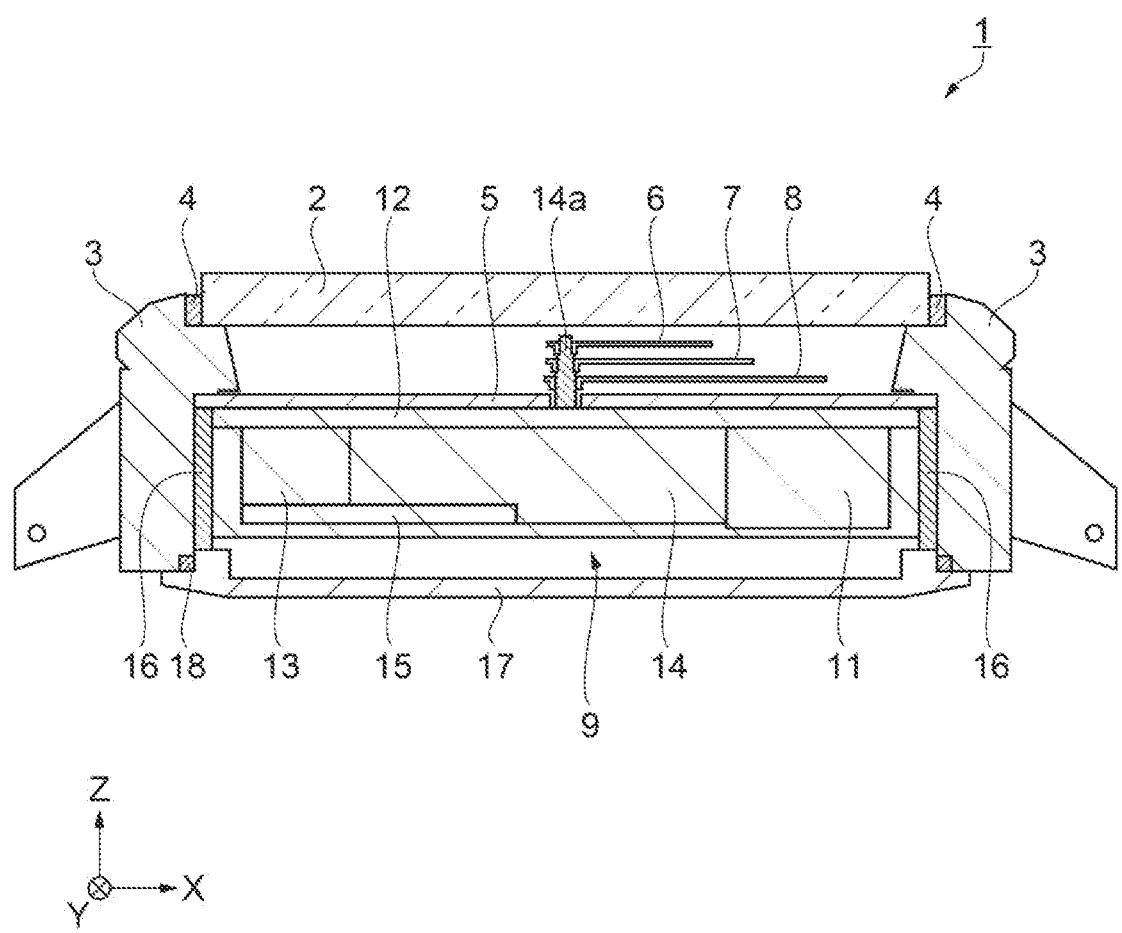
FIG. 1 is a schematic side cross-sectional view illustrating internal structure of a watch according to a first exemplary embodiment.

As illustrated in FIG. 1, a watch 1 is a wristwatch. A windshield 2 is disposed at a case 3, on an upper side of the figure of the watch 1. The windshield 2 side in a thickness direction of the watch 1 is defined as a positive Z direction. A 12 o'clock direction of the watch 1 is defined as a positive X direction. A 9 o'clock direction of the watch 1 is defined as a positive Y direction.

The windshield 2 is fixed to the case 3 via a first gasket 4. The windshield 2 is formed of a material having optical transparency such as glass. A dial 5 is disposed in a negative Z direction of the windshield 2. Then, an hour hand 6, a minute hand 7, and a seconds hand 8 are disposed between the dial 5 and the windshield 2. An operator can see the hour hand 6, the minute hand 7, and the seconds hand 8 through the windshield 2. Indicators are disposed at the dial 5. The operator sees respective positions of the hour hand 6, the minute hand 7, the seconds hand 8, with respect to the indicators, and knows current time.

In the negative Z direction of the dial 5, a movement 9 and a battery 11 are disposed. The movement 9 includes a main plate 12. The main plate 12 is disposed facing the dial 5. A motor 13 and a train wheel 14 are disposed at the main plate 12. The movement 9 includes a printed wired board 15 that drives the motor 13. The printed wired board 15 includes a Central Processing Unit (CPU), a crystal oscillator, a frequency divider, and a motor driving circuit. The watch 1 is a quarts watch. There is a possibility that when static electricity flows to the printed wired board 15, a circuit element such as the CPU is destroyed. It is necessary to suppress the flow of static electricity to the printed wired board 15.

The printed wired board 15 controls a rotational speed of the motor 13. Torque of the motor 13 is transmitted to the train wheel 14. In a center of the figure, a hand shaft 14a of the train wheel 14 protrudes in the positive Z direction and penetrates the dial 5. The hour hand 6, the minute hand 7, and the seconds hand 8 are mounted to the protruding hand shaft 14a. The printed wired board 15 causes the motor 13 and the train wheel 14 to rotate the hour hand 6, the minute hand 7, and the seconds hand 8 to control a position of each hand pointing an indicator.

A guide frame 16 is disposed at an outer periphery in an X direction and a Y direction of the movement 9. The guide frame 16 is between the case 3 and the movement 9. When impact is applied to the watch 1 from the X direction and the Y direction, the guide frame 16 absorbs the impact. The impact applied to the movement 9 is reduced by the guide frame 16.

A case back 17 is disposed in the negative Z direction of the case 3. A second gasket 18 is disposed between the case back 17 and the case 3. The second gasket 18 prevents moisture from entering inside the watch 1.

Figure 2:
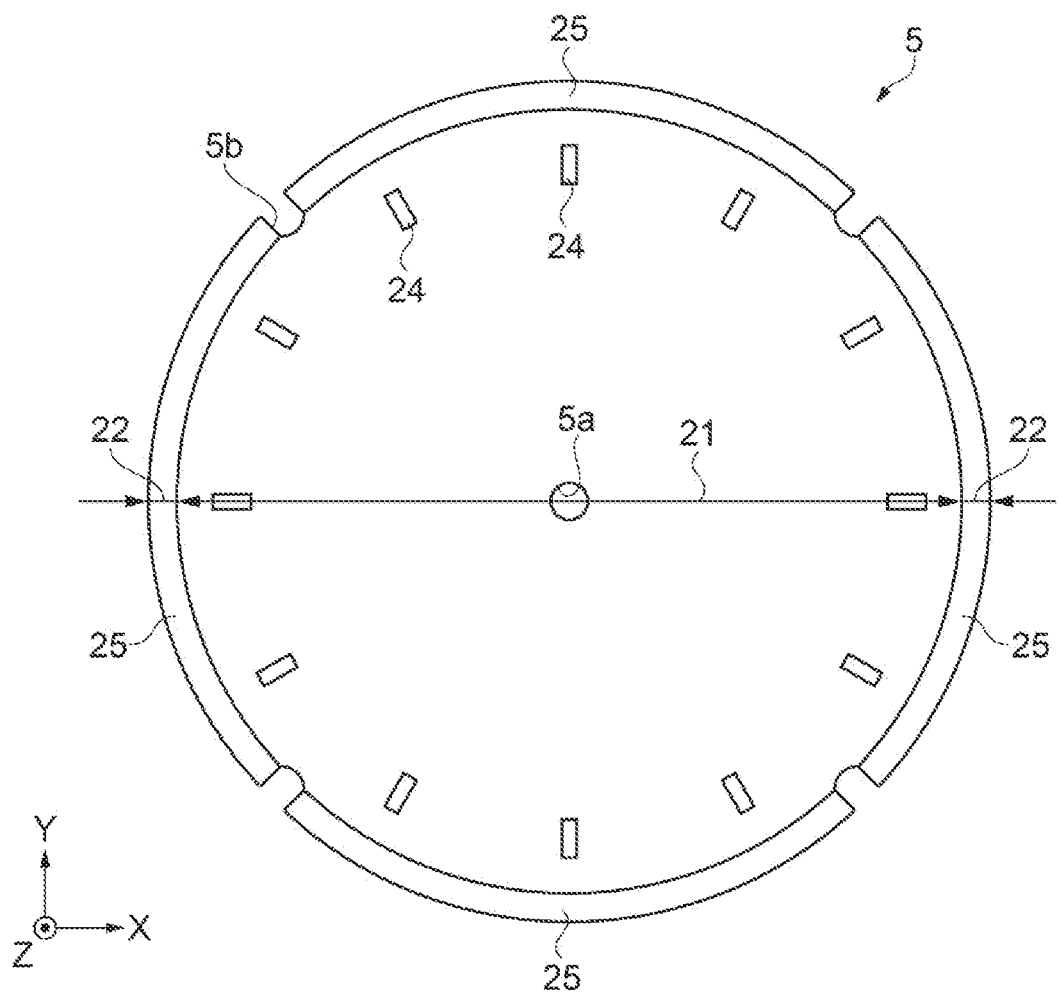
FIG. 2 is a schematic plan view illustrating structure of a dial.
Figure 3:
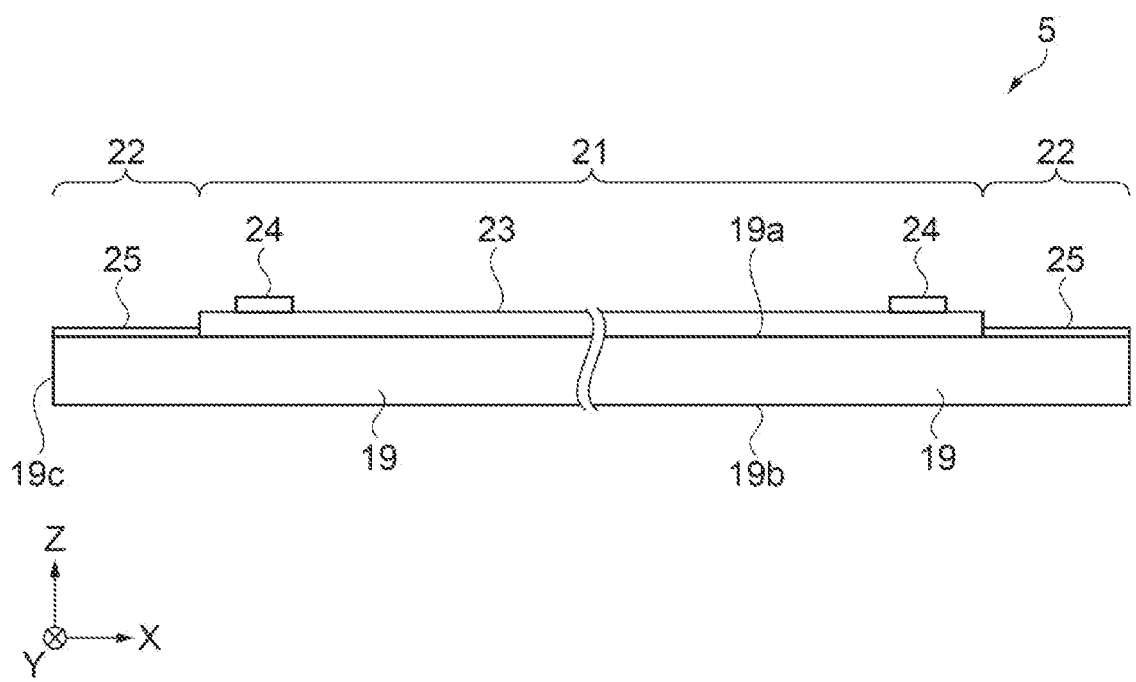
FIG. 3 is a schematic side view illustrating the structure of the dial.

As illustrated in FIG. 2 and FIG. 3, an outer shape of the dial 5 is not particularly limited, but in the present exemplary embodiment, for example, is a disk shape. A central hole 5a through which the hand shaft 14a penetrates is disposed in a center of the dial 5. Four recessed portions 5b are disposed at an outer periphery of the dial 5. The recessed portion 5b is used for positioning the dial 5 with respect to the case 3.

The dial 5 includes a conductive substrate 19. The substrate 19 includes a first surface 19a and a second surface 19b. The first surface 19a is a surface on the windshield 2 side. The second surface 19b is a surface on the movement 9 side. The dial 5 includes a central portion 21 and an outer peripheral portion 22. The central portion 21 is provided at a center of the first surface 19a of the substrate 19 in plan view. The outer peripheral portion 22 is provided at an outer periphery of the central portion 21. The outer peripheral portion 22 includes the first surface 19a, the second surface 19b, and a side surface 19c. The outer peripheral portion 22 overlaps the case 3 in plan view of the dial 5 viewed from the windshield 2 side.

The dial 5 includes a coating film 23 at the central portion 21. The coating film 23 is a resin film. The coating film 23 is formed by applying a resin material to the first surface 19a and drying the resin material. Various types of printing methods such as offset printing and screen printing are used as the application method. Indicators 24 are disposed at the coating film 23. The coating film 23 is non-conductive. Therefore, the surface of the central portion 21 is non-conductive. The non-conductive central portion 21 of the dial 5 is achieved by the coating film 23.

According to this configuration, the dial 5 includes the coating film 23 at the central portion 21. Any type of coating can be applied as the coating film 23, thereby increasing design of the dial 5.

The dial 5 does not include the coating film 23 at the outer peripheral portion 22. A surface of the outer peripheral portion 22 has conductivity. Additionally, the surface of the outer peripheral portion 22 is provided with a metal film 25 formed by plating. The outer peripheral portion 22 has the metal film 25 electrically coupled to the substrate 19 and having a conductive surface. A material of the metal film 25 is not particularly limited, but for example, nickel is used in the present exemplary embodiment.

According to this configuration, since plating is applied to the outer peripheral portion 22, oxidation, discoloration, and corrosion of the outer peripheral portion 22 can be suppressed. As a result, a state can be maintained where electrical resistance between the outer peripheral portion 22 and the case 3 is low. A film of gold may be overlaid and laminated at a film of nickel. Thereby, contact resistance can be reduced.

Manufacturing processes of the dial 5 are not particularly limited, but in the present exemplary embodiment, for example, the dial 5 is manufactured in the following order of processes. First, a plate-shaped material is subjected to blank processing, and an outer shape of the substrate 19 and the central hole 5a are formed. Next, the substrate 19 is cleaned. The coating film 23 is formed at the first surface 19a of the substrate 19. Next, the indicators 24 are printed. Next, cutting is applied to the outer peripheral portion 22 of the first surface 19a. A machining center under numerical control is used for the cutting. In the cutting, the substrate 19 is cut to a depth of approximately 0.05 mm from a surface of the substrate 19. At this time, the coating film 23 at the outer peripheral portion 22 is removed by the cutting. The substrate 19 is exposed from the outer peripheral portion 22. Next, nickel plating is applied to the exposed substrate 19 of the outer peripheral portion 22. The plating may be electroplating or electroless plating. The metal film 25 may be formed at the side surface 19c and the second surface 19b. In the above processes, the dial 5 is completed.

Figure 4:
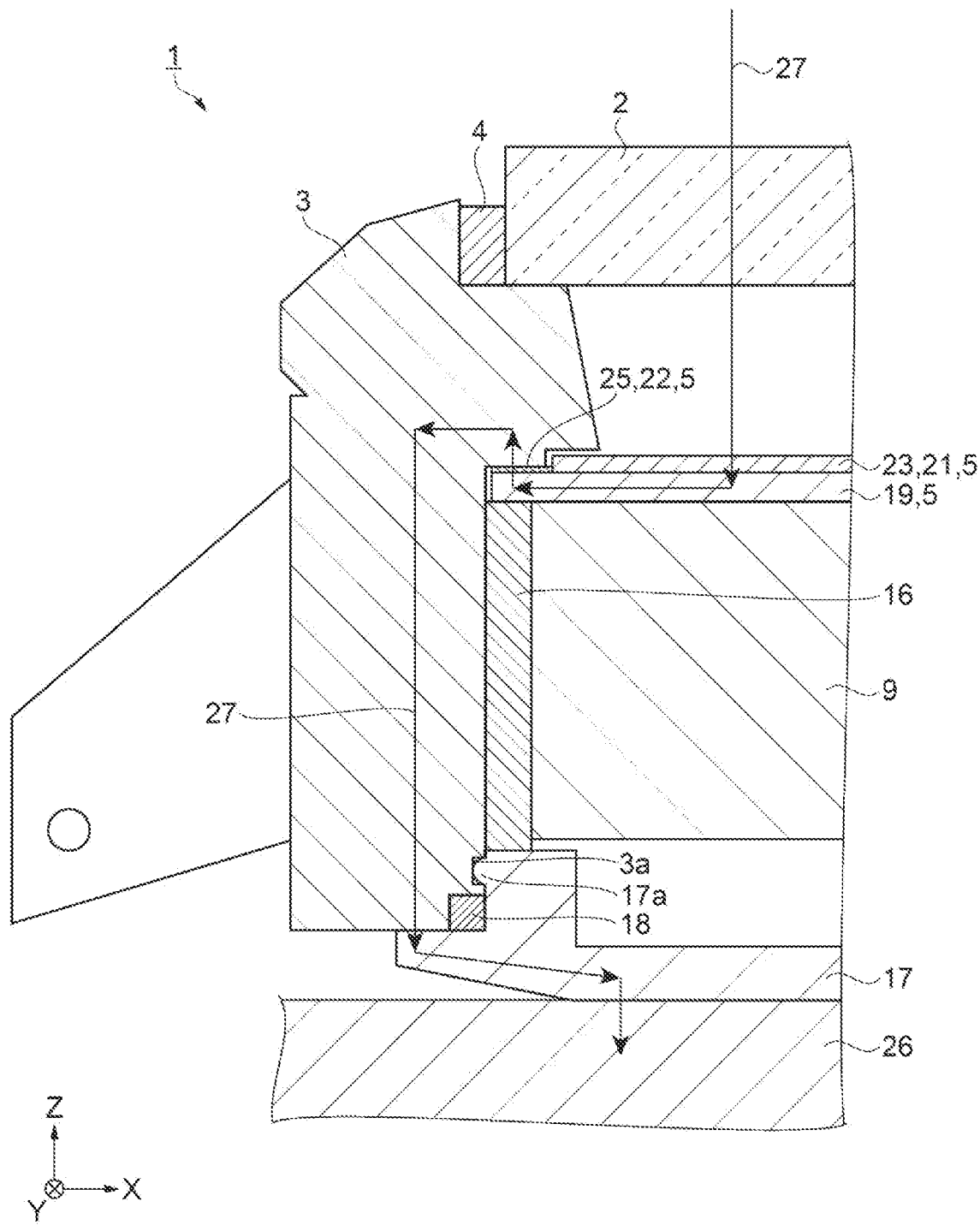
FIG. 4 is a schematic side cross-sectional view of a main part for explaining structure in which the dial and a case are electrically coupled.

As illustrated in FIG. 4, the dial 5 is sandwiched between the case 3 and the guide frame 16 in a Z direction. Furthermore, the dial 5 and the guide frame 16 are sandwiched between the case 3 and the case back 17. The guide frame 16 is formed of a resin material. The guide frame 16 contracts by being sandwiched between the case 3 and the case back 17. The guide frame 16 presses the dial 5. The metal film 25 at the outer peripheral portion 22 of the dial 5 is pressed by the case 3.

A protruding portion 17a is formed at an outer periphery of the case back 17. The recessed portion 3a is formed at a location facing the protruding portion 17a of the case 3. When the case 3 and the case back 17 are assembled, the protruding portion 17a enters the recessed portion 3a. The case 3 and the case back 17 are fitted to each other. A material of each of the case 3 and the case back 17 is metal, and thus the case 3 and the case back 17 are electrically coupled. Accordingly, the case 3 is electrically coupled to the metal film 25 at the outer peripheral portion 22 of the dial 5, and is electrically coupled to the case back 17. This "electrically coupled" refers to a case of being electrically coupled in direct contact, and a case of being electrically coupled via a conductive member.

The watch 1 is mounted on a human body 26. Static electricity is discharged to the dial 5. A current 27 due to the static electricity enters the substrate 19 of the dial 5. The current 27 due to the static electricity entering the dial 5 passes through the case 3 that is electrically coupled to the outer peripheral portion 22 of the dial 5, and flows to the case back 17. Specifically, the current 27 enters the human body 26 through the substrate 19, the metal film 25, the case 3, and the case back 17.

According to this configuration, the current 27 due to the static electricity entering the dial 5 flows to the human body 26 via the substrate 19, the outer peripheral portion 22 of the dial 5, the case 3, and the case back 17. A coil spring that occupies predetermined volume as in JP 9-230065 A is not disposed in the watch 1. Specifically, a part such as a coil spring that conducts the current 27 due to the static electricity is not disposed in the watch 1. As a result, volume to be occupied by a coil spring inside the case 3 can be reduced. When an inner side of the case 3 is reduced, the watch 1 can be made small. In addition, a design of the case 3 may be adopted in which an outer surface has large unevenness. In addition, since a coil spring is not disposed, parts of a coil spring can be reduced. In addition, when viewed from the windshield 2 side, the case 3 and the dial 5 are electrically coupled at a location where the case 3 and the dial 5 overlap. Accordingly, a space inside the case 3 can be effectively utilized.

Second Exemplary Embodiment

The present exemplary embodiment differs from the first exemplary embodiment in that a watch includes a conductive portion between the metal film 25 at the dial 5 and the case 3. Note that, configurations identical to those in the first exemplary embodiment will be denoted by the same reference signs and redundant descriptions will be omitted.

Figure 5:
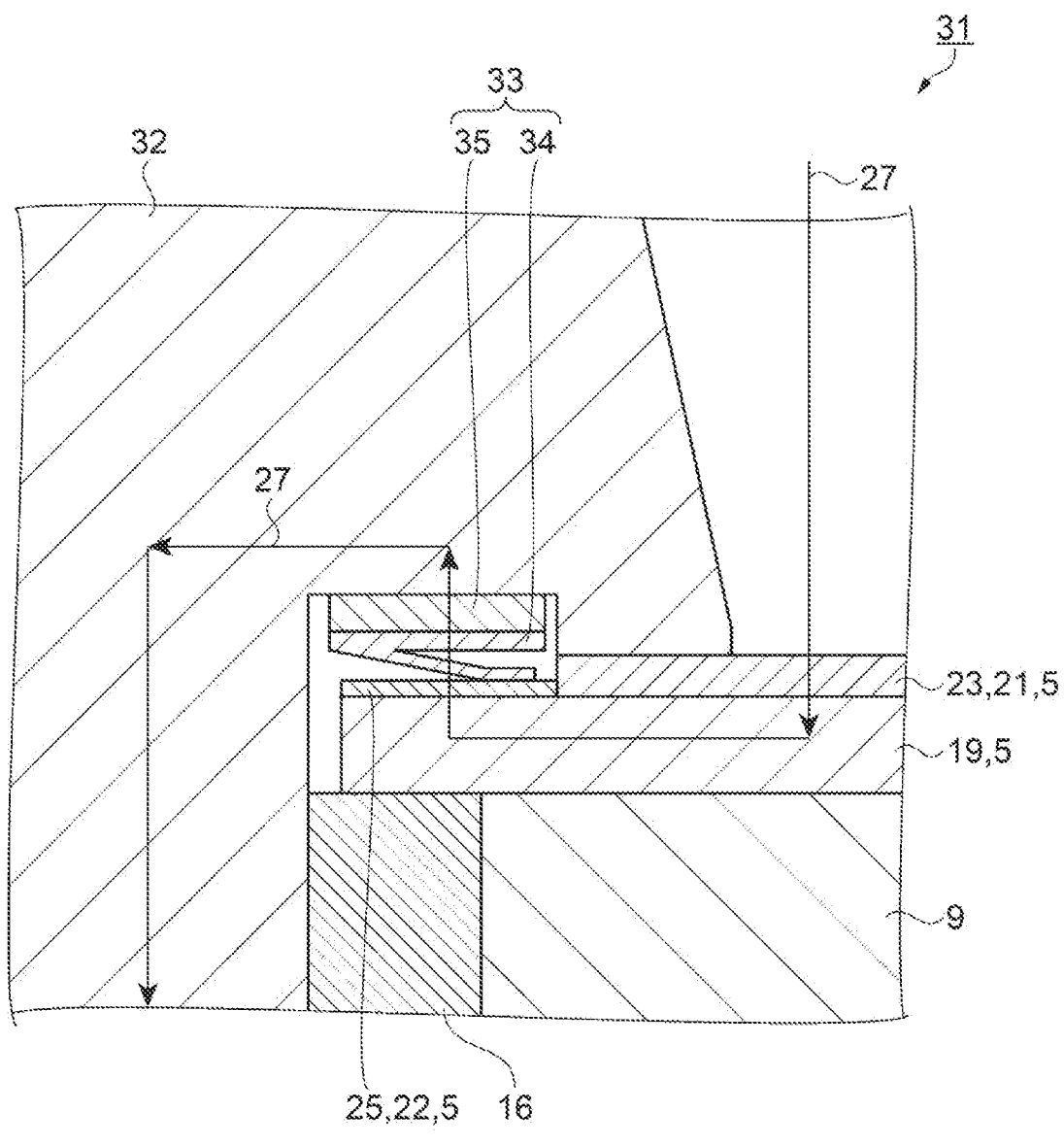
FIG. 5 is a schematic side cross-sectional view of a main part for explaining structure in which a dial and a case according to a second exemplary embodiment are electrically coupled.

As illustrated in FIG. 5, a watch 31 includes a case 32 and the dial 5. A conductive portion 33 is disposed between the case 32 and the outer peripheral portion 22 of the dial 5. The conductive portion 33 electrically couples the outer peripheral portion 22 of the dial 5 and the case 32. The conductive portion 33 is configured with a leaf spring 34 and a conductive double-sided tape 35. The conductive double-sided tape 35 fixes the leaf spring 34 to the case 32. The leaf spring 34 has elasticity. Accordingly, the conductive portion 33 has elasticity.

According to this configuration, the conductive portion 33 electrically couples the outer peripheral portion 22 of the dial 5 and the case 32. As a result, the outer peripheral portion 22 and the case 32 can be reliably electrically coupled.

According to this configuration, the conductive portion 33 has elasticity, and thus presses the outer peripheral portion 22 of the dial 5 and the case 32. As a result, the conductive portion 33 can reduce contact resistance between the outer peripheral portion 22 and the case 32.

Static electricity is discharged to the dial 5. The current 27 due to the static electricity enters the substrate 19 of the dial 5. The current 27 due to the static electricity that enters the dial 5 enters the human body 26 through the substrate 19, the metal film 25, the conductive portion 33, the case 32, and the case back 17.

Third Exemplary Embodiment

The present exemplary embodiment differs from the first exemplary embodiment in that an outer peripheral portion of a dial is provided with a leaf spring. Note that, configurations identical to those in the first exemplary embodiment will be denoted by the same reference signs and redundant descriptions will be omitted.

Figure 6:
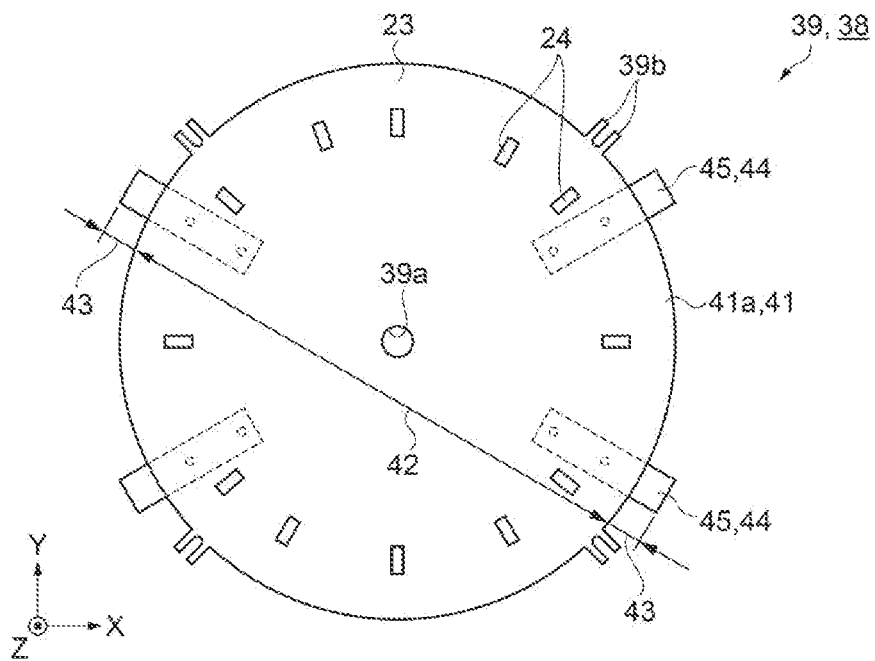
FIG. 6 is a schematic plan view illustrating structure of a dial according to a third exemplary embodiment.
Figure 7:
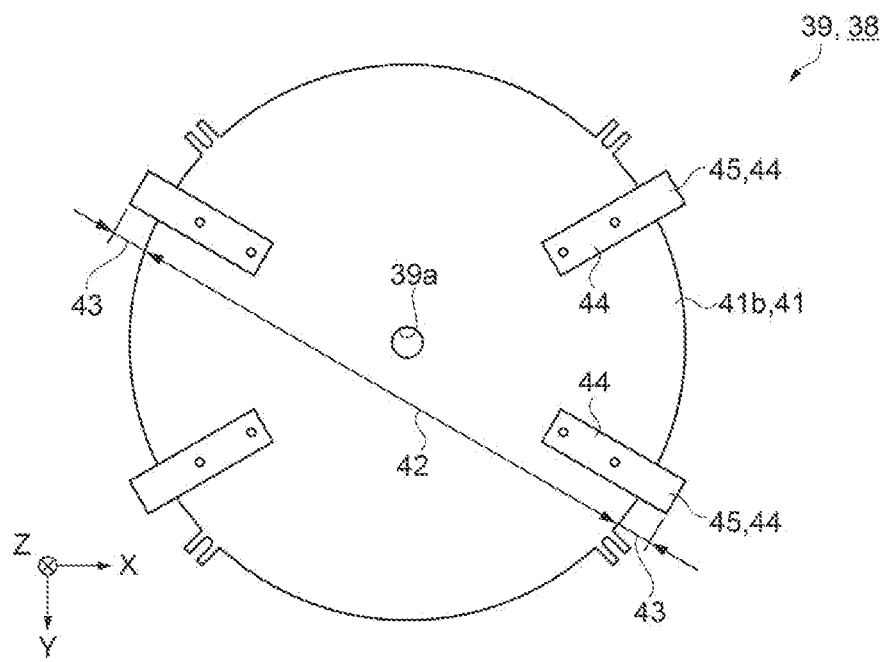
FIG. 7 is a schematic plan view illustrating structure of a dial.

As illustrated in FIG. 6 and FIG. 7, a watch 38 includes a dial 39. FIG. 6 is a diagram of the dial 39 viewed from the windshield 2 side. FIG. 7 is a diagram of the dial 39 viewed from the movement 9 side. The dial 39 includes a substrate 41 that is a conductive member. The substrate 41 includes a first surface 41a and a second surface 41b. The first surface 41a is a surface on the windshield 2 side. The second surface 41b is the surface on the movement 9 side.

An outer shape of the dial 39 is not particularly limited, but in the present exemplary embodiment, for example, is a disk shape. A central hole 39a through which the hand shaft 14a penetrates is disposed in a center of the dial 39. Four recessed and protruding portions 39b are disposed at an outer periphery of the dial 39. The recessed and protruding portion 39b is used for performing positioning with respect to the case 3.

The dial 39 has a central portion 42 and an outer peripheral portion 43. The central portion 42 is above the substrate 41 in plan view. The outer peripheral portion 43 is outside an outer periphery of the substrate 41.

The dial 39 includes the coating film 23 at the central portion 42. The coating film 23 is a resin film. The coating film 23 is formed by applying a resin material to the first surface 41a and drying the resin material. The coating film 23 is non-conductive. Therefore, the surface of the central portion 21 is non-conductive.

Four leaf springs 44 are fixed to the second surface 41b of the substrate 41 of the dial 39, for example, by spot welding. The leaf spring 44 located at the outer peripheral portion 43 is a conductive portion 45. The conductive portion 45 also serves as the outer peripheral portion 43. When the dial 39 is viewed from the windshield 2 side, the leaf spring 44 protrudes from the outer periphery of the substrate 41. Note that, the four leaf springs 44 may be fixed in a method other than spot welding, such as a conductive double-sided tape.

Figure 8:
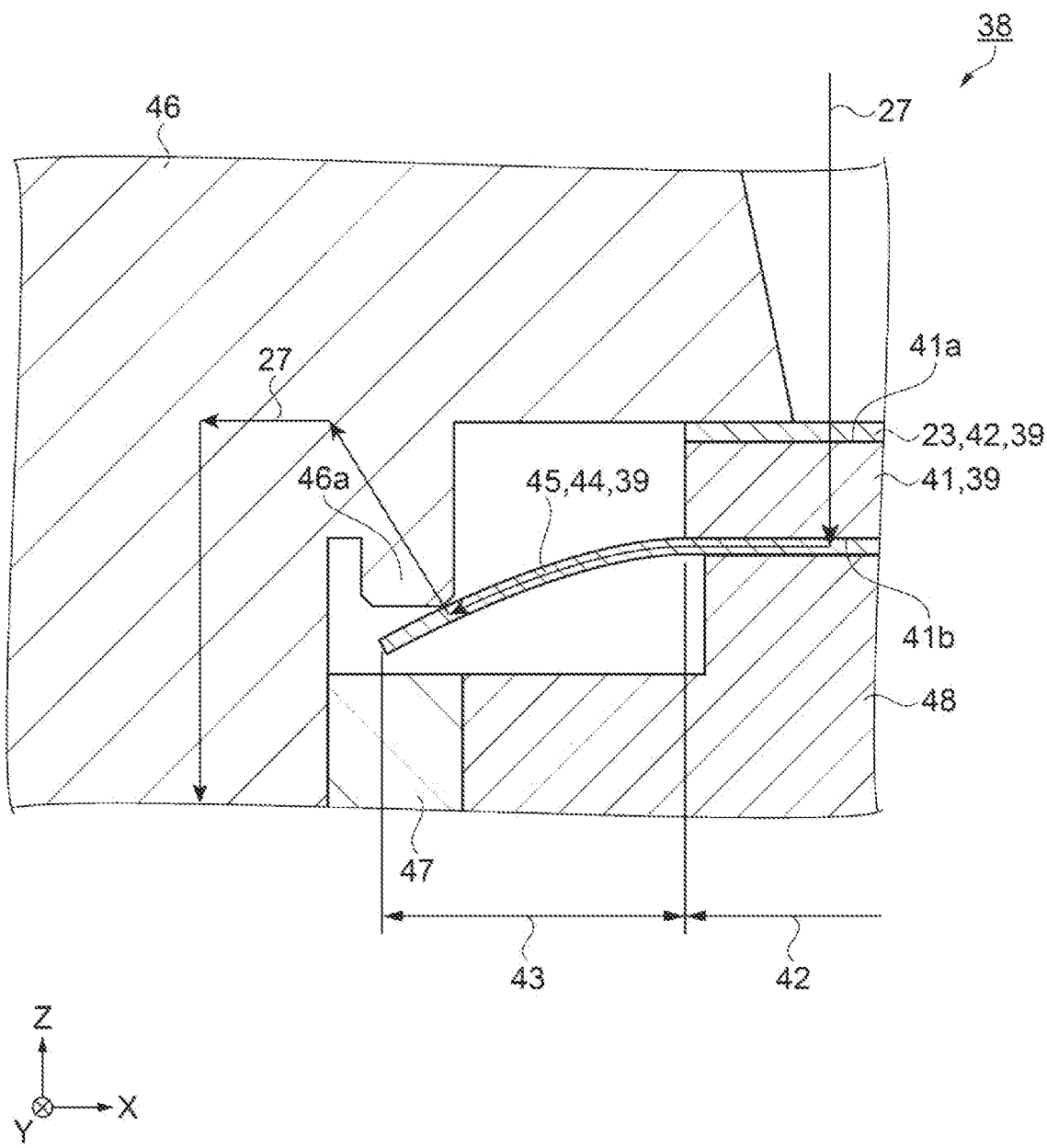
FIG. 8 is a schematic side cross-sectional view of a main part for explaining structure in which the dial and a case are electrically coupled.

As illustrated in FIG. 8, the watch 38 includes a case 46, a guide frame 47, and a movement 48. In the Z direction, the case 46 includes a first protruding portion 46a at a location facing the conductive portion 45. The first protruding portion 46a is in contact with and electrically coupled to the conductive portion 45 of the outer peripheral portion 43.

According to this configuration, the outer peripheral portion 43 is in contact with the first protruding portion 46a. There is a possibility that when the leaf spring 44 is twisted without the first protruding portion 46a, the leaf spring 44 and the case 46 are in contact at a point. By providing the first protruding portion 46a, it is possible to ensure an area in which the case 46 and the conductive portion 45 of the outer peripheral portion 43 are in contact when the leaf spring 44 is twisted. Accordingly, a contact failure between the case 46 and the dial 39 can be prevented.

In the dial 39, the conductive portion 45 is the outer peripheral portion 43. The conductive portion 45 is electrically coupled to the case 46. Accordingly, the conductive portion 45 electrically couples the outer peripheral portion 43 and the case 46.

According to this configuration, the conductive portion 45 electrically couples the outer peripheral portion 43 and the case 46. As a result, the outer peripheral portion 43 and the case 46 can be reliably electrically coupled.

The conductive portion 45 is a part of the leaf spring 44 and has elasticity. According to this configuration, since the conductive portion 45 has elasticity, the outer peripheral portion 43 presses the case 46. As a result, the conductive portion 45 can reduce contact resistance between the outer peripheral portion 43 and the case 46. Note that, the leaf spring 44 may be provided at the first surface 41a of the substrate 41. While a method of fixing the leaf spring 44 is not particularly limited, for example, in the present exemplary embodiment, a conductive double-sided tape is used.

Static electricity is discharged to the dial 39. The current 27 due to the static electricity enters the substrate 41 of the dial 39. The current 27 due to the static electricity that enters the dial 39 enters the human body 26 through the substrate 41, the conductive portion 45, the case 46, and the case back 17.

Fourth Exemplary Embodiment

The present exemplary embodiment differs from the first exemplary embodiment in that a portion corresponding to the case 3 is configured with a case and a first member. Note that, configurations identical to those in the first exemplary embodiment will be denoted by the same reference signs and redundant descriptions will be omitted.

Figure 9:
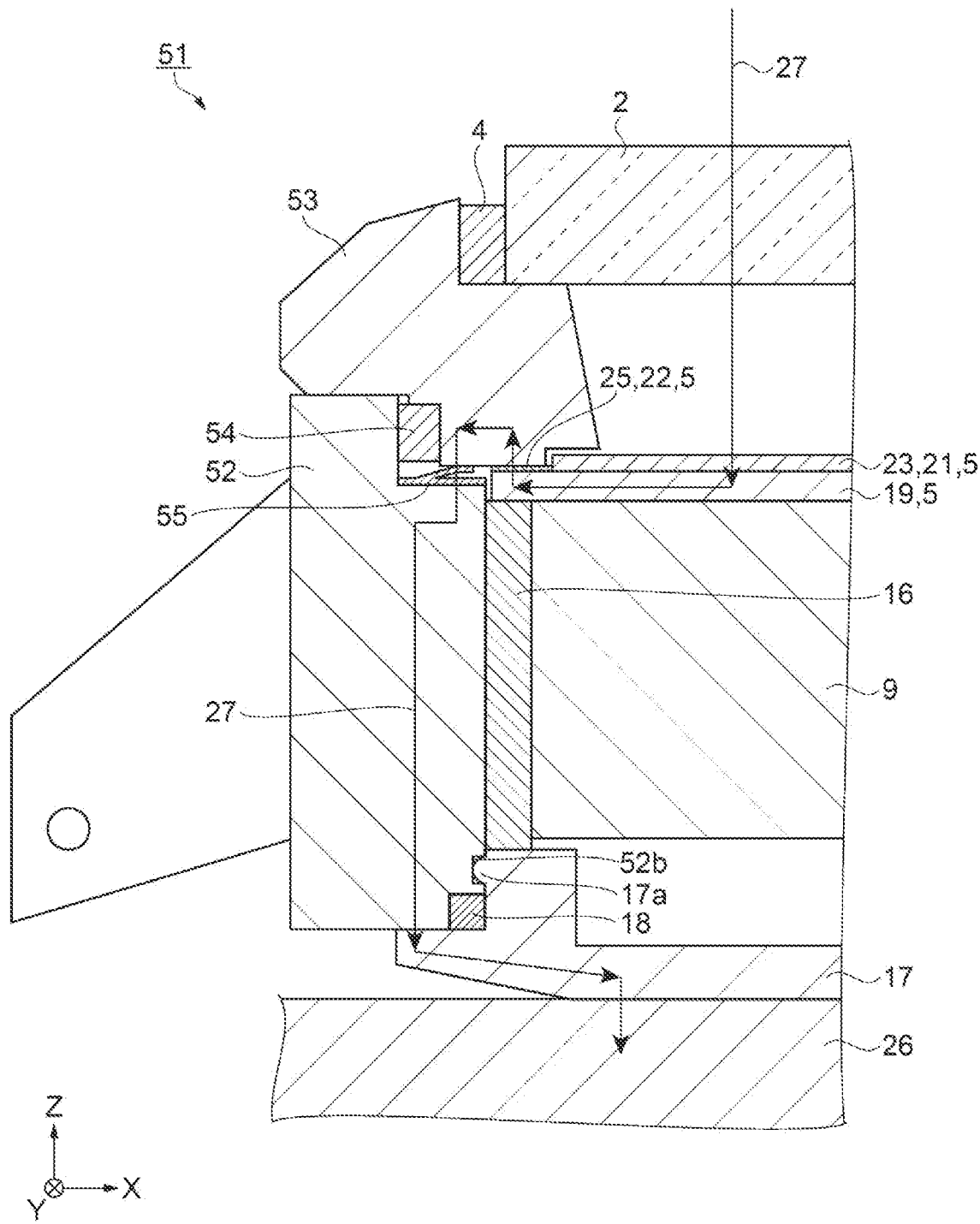
FIG. 9 is a schematic side cross-sectional view of a main part for explaining structure in which the dial and a case according to a fourth exemplary embodiment are electrically coupled.

As illustrated in FIG. 9, a watch 51 includes a case 52 and a first member 53. The first member 53 is also referred to as a bezel. The case 52 and the first member 53 are joined via a third gasket 54. The windshield 2 is fixed to the first member 53 via the first gasket 4. The dial 5 is fixed by being sandwiched by the first member 53 and the guide frame 16. The outer peripheral portion 22 of the dial 5 is in contact with and electrically coupled to the first member 53. A first leaf spring 55 is disposed between the case 52 and the first member 53. The first leaf spring 55 ensures electric coupling between the case 52 and the first member 53.

The first member 53 is in contact with the outer peripheral portion 22 of the dial 5. The first member 53 is electrically coupled to the metal film 25 at the outer peripheral portion 22. The first member 53 is electrically coupled to the case 52. According to this configuration, the case 52 is electrically coupled to the first member 53. The first member 53 is electrically coupled to the outer peripheral portion 22 of the dial 5. The case 52 has structure for storing the movement 9. As compared with a case where the case 52 and the first member 53 are integrally formed, the first member 53 can be made in a shape so as to be easily coupled to the outer peripheral portion 22. Also, it is possible to make it easy to manufacture the case 52 and the first member 53. The outer peripheral portion 22 overlaps the first member 53 in plan view of the dial 5 viewed from the windshield 2 side. Note that, a portion where the first member 53 is in contact with the dial 5 may be a dial ring.

A recessed portion 52b is formed at a location facing the protruding portion 17a of the case 52. When the case 52 and the case back 17 are assembled, the protruding portion 17a enters the recessed portion 52b.

The current 27 due to static electricity that enters the dial 5 enters the human body 26 through the substrate 19, the metal film 25, the first member 53, the first leaf spring 55, the case 52, and the case back 17.

Fifth Exemplary Embodiment

The present exemplary embodiment differs from the fourth exemplary embodiment in that the conductive portion 33 is disposed between the dial 5 and a first member. Note that, configurations identical to those in the fourth exemplary embodiment will be denoted by the same reference signs and redundant descriptions will be omitted.

Figure 10:
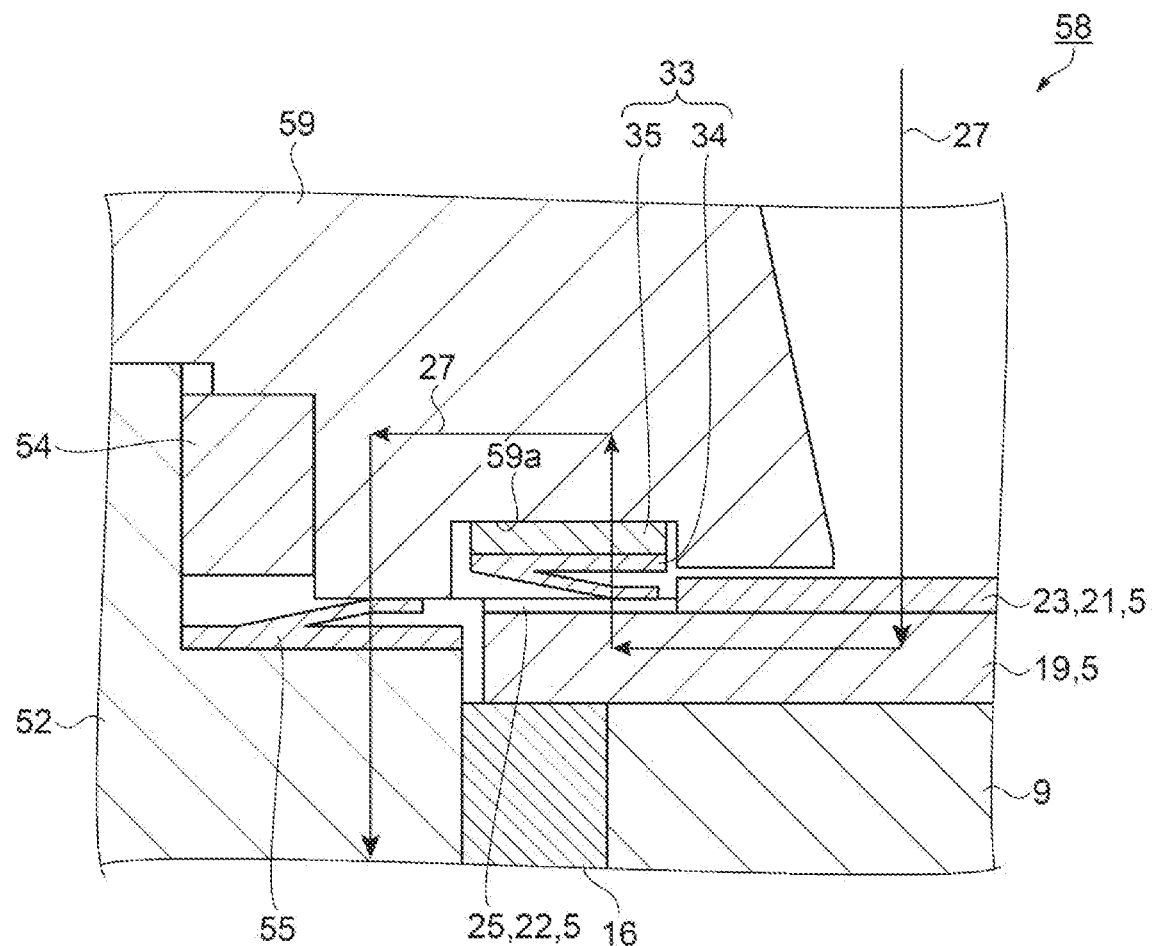
FIG. 10 is a schematic side cross-sectional view of a main part for explaining structure in which the dial and the case according to a fifth exemplary embodiment are electrically coupled.

As illustrated in FIG. 10, a watch 58 includes the case 52 and a first member 59. The case 52 and the first member 59 are joined via the third gasket 54. The windshield 2 is fixed to the first member 59 via the first gasket 4. The dial 5 is fixed by being sandwiched by the first member 59 and the guide frame 16.

A recessed portion 59a is formed in the first member 59 at a location facing the outer peripheral portion 22 of the dial 5. The conductive portion 33 is disposed at the recessed portion 59a between the first member 59 and the outer peripheral portion 22 of the dial 5. The conductive portion 33 electrically couples the outer peripheral portion 22 of the dial 5 and the first member 59. The conductive portion 33 is configured with the leaf spring 34 and the conductive double-sided tape 35. The conductive double-sided tape 35 fixes the leaf spring 34 to the first member 59. The leaf spring 34 has elasticity. Accordingly, the conductive portion 33 has elasticity.

According to this configuration, the conductive portion 33 electrically couples the outer peripheral portion 22 and the first member 59. As a result, the outer peripheral portion 22 and the first member 59 can be reliably electrically coupled.

The current 27 due to static electricity that enters the dial 5 enters the human body 26 through the substrate 19, the metal film 25, the leaf spring 34, the conductive double-sided tape 35, the first member 59, the first leaf spring 55, the case 52, and the case back 17. Accordingly, since the current 27 due to the static electricity does not flow into the printed wired board 15, the watch 58 has static electricity resistance.

Sixth Exemplary Embodiment

The present exemplary embodiment differs from the third exemplary embodiment in that a portion corresponding to the case 3 is configured with a case and a first member as in the case of the fourth exemplary embodiment. Note that, configurations identical to those in the third exemplary embodiment and the fourth exemplary embodiment will be denoted by the same reference signs and redundant descriptions will be omitted.

Figure 11:
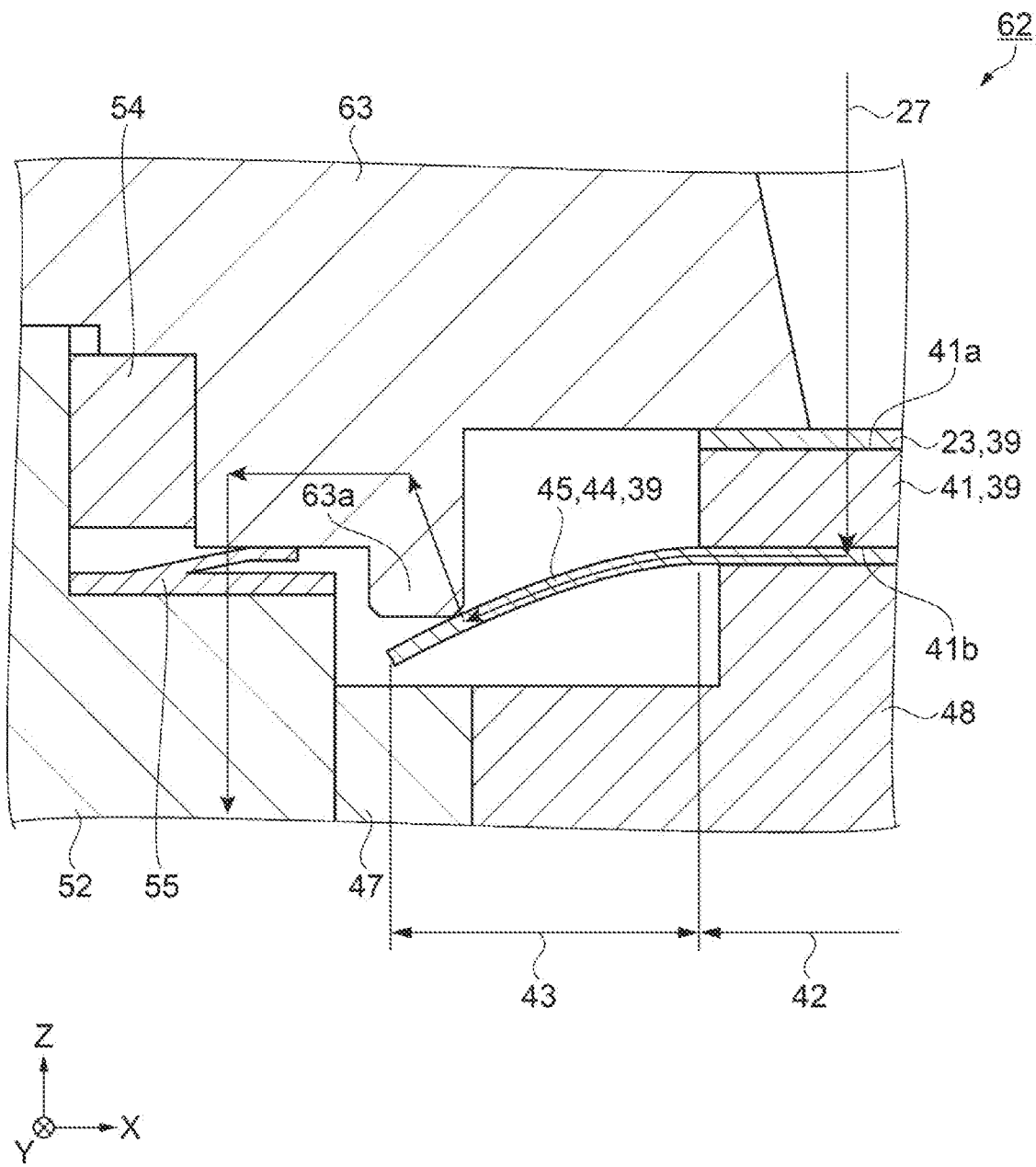
FIG. 11 is a schematic side cross-sectional view of a main part for explaining structure in which the dial and the case according to a sixth exemplary embodiment are electrically coupled.

As illustrated in FIG. 11, a watch 62 includes the dial 39. The four leaf springs 44 are fixed to the second surface 41b of the dial 39 by spot welding. The leaf spring 44 located at the outer peripheral portion 43 is a conductive portion 45. The conductive portion 45 also serves as the outer peripheral portion 43.

The watch 62 includes the case 52, a first member 63, the guide frame 47, and the movement 48. In the Z direction, the first member 63 has a second protruding portion 63a at a location facing the conductive portion 45. The second protruding portion 63a is in contact with and electrically coupled to the leaf spring 44, which is the conductive portion 45 of the outer peripheral portion 43.

According to this configuration, the leaf spring 44, which is the conductive portion 45 of the outer peripheral portion 43, is in contact with the second protruding portion 63a. There is a possibility that when the leaf spring 44 is twisted without the second protruding portion 63a, the leaf spring 44 and the first member 63 are in contact at a point. By providing the second protruding portion 63a, it is possible to ensure an area in which the first member 63 and the conductive portion 45 of the outer peripheral portion 43 are in contact. A contact failure between the first member 63 and the dial 39 can be prevented.

The case 52 and the first member 63 are joined via the third gasket 54. The dial 39 is fixed by being sandwiched between the first member 63 and the movement 48. The first leaf spring 55 is disposed between the case 52 and the first member 63.

The current 27 due to static electricity that enters the dial 39 enters the human body 26 through the substrate 41, the leaf spring 44, the second protruding portion 63a, the first member 63, the first leaf spring 55, the case 52, and the case back 17. Accordingly, since the current 27 due to the static electricity does not flow into the printed wired board 15, the watch 62 has static electricity resistance.

Seventh Exemplary Embodiment

The present exemplary embodiment differs from the sixth exemplary embodiment in that the second protruding portion 63a of the first member 63 is absent, and a shape of the leaf spring 44 is different. Note that, configurations identical to those in the sixth exemplary embodiment will be denoted by the same reference signs and redundant descriptions will be omitted.

Figure 12:
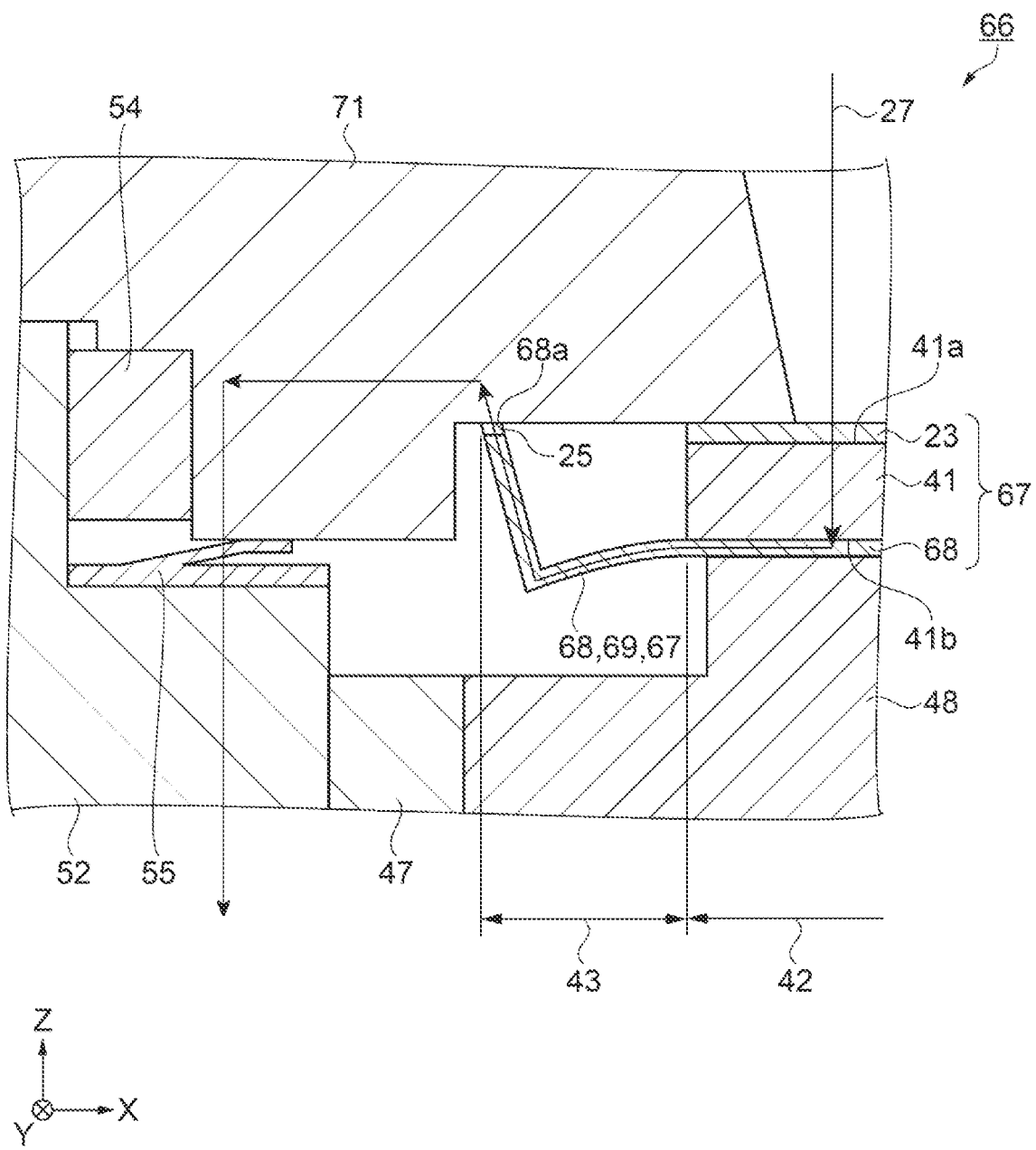
FIG. 12 is a schematic side cross-sectional view of a main part for explaining structure in which a dial and the case according to a seventh exemplary embodiment are electrically coupled.

As illustrated in FIG. 12, a watch 66 includes a dial 67. The dial 67 includes the substrate 41. The dial 67 has the central portion 42 and the outer peripheral portion 43. The central portion 42 is above the substrate 41 in plan view. The outer peripheral portion 43 is outside an outer periphery of the substrate 41. The coating film 23 is disposed at the first surface 41a of the substrate 41.

Four leaf springs 68 are fixed to the second surface 41b of the substrate 41 by spot welding. A position of the leaf spring 68 is the same as that of the plate spring 44 of the third exemplary embodiment in plan view of the dial 67. The leaf spring 68 located at the outer peripheral portion 43 is a conductive portion 69. The conductive portion 69 also serves as the outer peripheral portion 43. The leaf spring 68 is bent at a substantially right angle in the middle of the outer peripheral portion 43, and an end surface 68a at a leading end of the leaf spring 68 faces in the positive Z direction.

The watch 66 includes the case 52, a first member 71, the guide frame 47, and the movement 48. At the end surface 68a at the leading end of the leaf spring 68, the leaf spring 68 biases the first member 71. The end surface 68a at the leading end of the leaf spring 68 is pressed by the first member 71, and thus the leaf spring 68 and the first member 71 are electrically coupled reliably. Note that, the metal film 25 may be disposed at the end surface 68a at the leading end. Thereby, contact resistance can be reduced.

The current 27 due to static electricity that enters the dial 67 enters the human body 26 through the substrate 41, the leaf spring 68, the first member 71, the first leaf spring 55, the case 52, and the case back 17. Accordingly, since the current 27 due to the static electricity does not flow into the printed wired board 15, the watch 66 has static electricity resistance.

Eighth Exemplary Embodiment

The present exemplary embodiment differs from the seventh exemplary embodiment in a shape of the leaf spring 68.

Note that, configurations identical to those in the seventh exemplary embodiment will be denoted by the same reference signs and redundant descriptions will be omitted.

Figure 13:
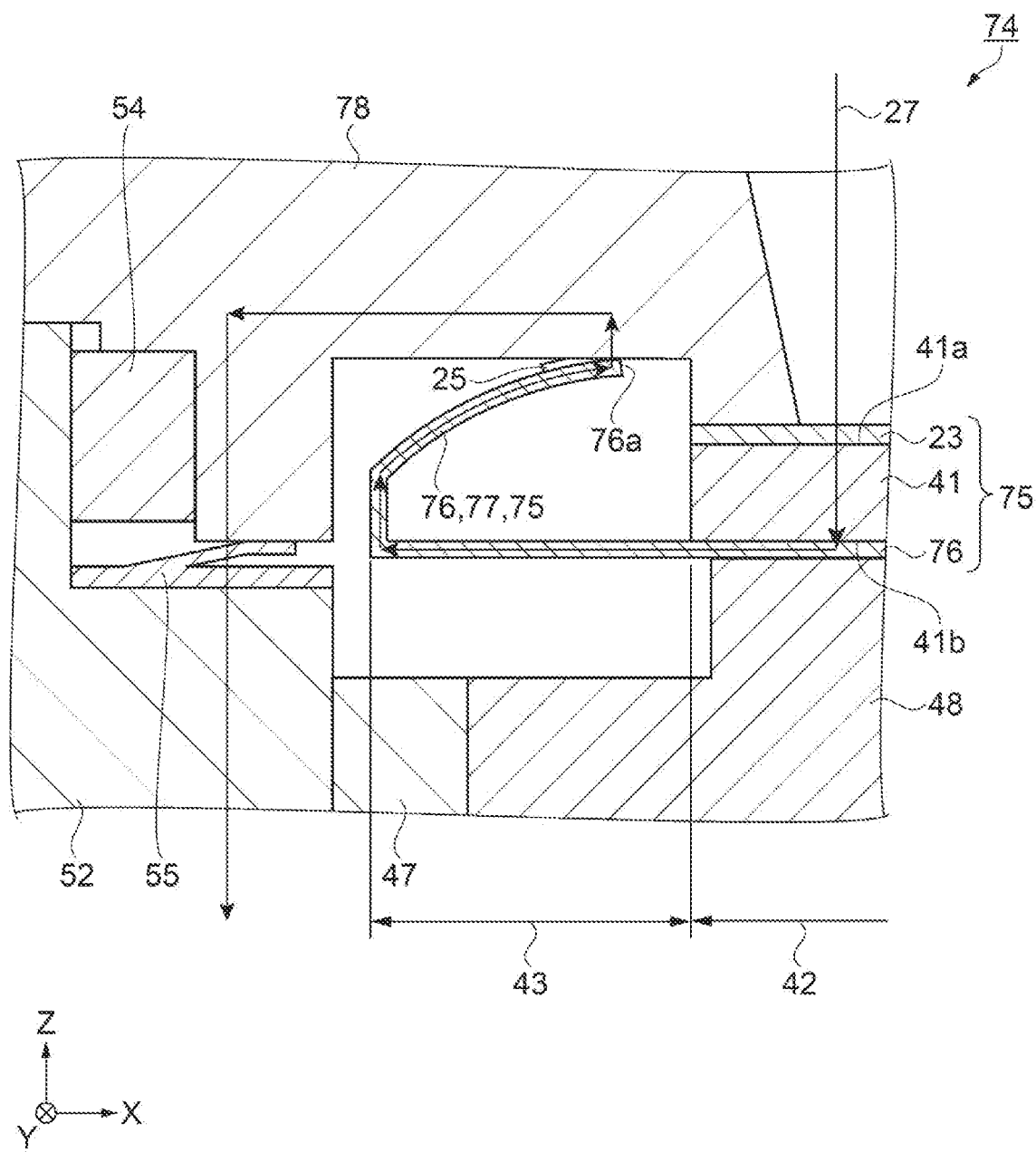
FIG. 13 is a schematic side cross-sectional view of a main part for explaining structure in which a dial and the case according to an eighth exemplary embodiment are electrically coupled.

As illustrated in FIG. 13, a watch 74 includes a dial 75. The dial 75 includes the substrate 41. Four leaf springs 76 are fixed to the second surface 41b of the substrate 41 by spot welding. A position of the leaf spring 76 is the same as that of the plate spring 44 of the third exemplary embodiment in plan view of the dial 75. The leaf spring 76 located at the outer peripheral portion 43 is a conductive portion 77. The conductive portion 77 also serves as the outer peripheral portion 43. The leaf spring 76 is bent at an angle exceeding a right angle in the middle of the outer peripheral portion 43, and a leading end 76a of the leaf spring 76 faces in the positive Z direction and faces the central portion 42 side.

The watch 74 includes the case 52, a first member 78, the guide frame 47, and the movement 48. At the leading end 76a of the leaf spring 76, the leaf spring 76 biases the first member 78. The leading end 76a of the leaf spring 76 is pressed by the first member 78, and thus the leaf spring 76 and the first member 78 are electrically coupled reliably. Note that, the metal film 25 may be disposed at the leading end 76a. Thereby, contact resistance can be reduced.

The current 27 due to static electricity that enters the dial 75 enters the human body 26 through the substrate 41, the leaf spring 76, the first member 78, the first leaf spring 55, the case 52, and the case back 17. Accordingly, since the current 27 due to the static electricity does not flow into the printed wired board 15, the watch 74 has static electricity resistance.

A spring length of the leaf spring 76 of the present exemplary embodiment can be made longer than that of the leaf spring 68 of the seventh exemplary embodiment. Accordingly, displacement of the leaf spring 76 can be increased.

Ninth Exemplary Embodiment

The present exemplary embodiment differs from the sixth exemplary embodiment in that the leaf spring 44 is electrically coupled to a case. Note that, configurations identical to those in the sixth exemplary embodiment will be denoted by the same reference signs and redundant descriptions will be omitted.

Figure 14:
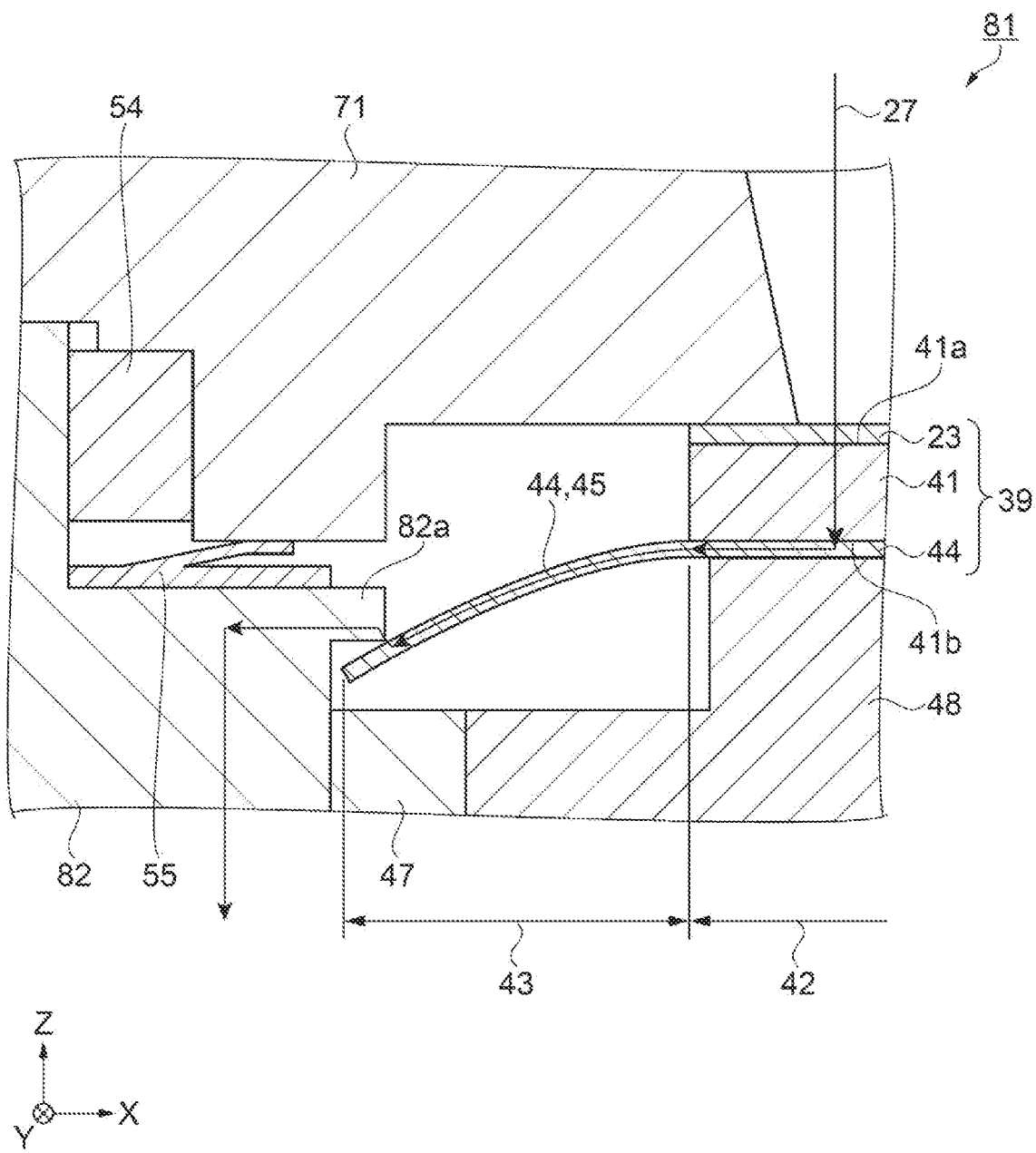
FIG. 14 is a schematic side cross-sectional view of a main part for explaining structure in which the dial and a case according to a ninth exemplary embodiment are electrically coupled.

As illustrated in FIG. 14, a watch 81 includes the dial 39 of the sixth exemplary embodiment. In the dial 39, the four leaf springs 44 are fixed to the second surface 41b of the substrate 41 by spot welding. The leaf spring 44 is the conductive portion 45 in the outer peripheral portion 43.

The watch 81 includes a case 82, the first member 71 of the seventh exemplary embodiment, the guide frame 47, and the movement 48. The conductive portion 45 electrically couples the outer peripheral portion 43 and the case 82.

According to this configuration, the conductive portion 45 electrically couples the outer peripheral portion 43 and the case 82. As a result, the outer peripheral portion 43 and the case 82 can be reliably coupled.

In the figure, the case 82 has a first protruding portion 82a at a location facing the conductive portion 45 in the positive X direction. The first protruding portion 82a is in contact with and electrically coupled to the leaf spring 44, which is the conductive portion 45 of the outer peripheral portion 43.

According to this configuration, the outer peripheral portion 43 is in contact with the first protruding portion 82a of the case 82. By providing the first protruding portion 82a, it is possible to ensure an area in which the case 82 and the conductive portion 45 of the outer peripheral portion 43 are in contact.

The current 27 due to static electricity that enters the dial 39 enters the human body 26 through the substrate 41, the leaf spring 44, the first protruding portion 82a, the case 82, and the case back 17. Accordingly, since the current 27 due to the static electricity does not flow into the printed wired board 15, the watch 81 has static electricity resistance.

Tenth Exemplary Embodiment

The present exemplary embodiment differs from the ninth exemplary embodiment in that the first protruding portion 82a is not installed at a case. Note that, configurations identical to those in the ninth exemplary embodiment will be denoted by the same reference signs and redundant descriptions will be omitted.

Figure 15:
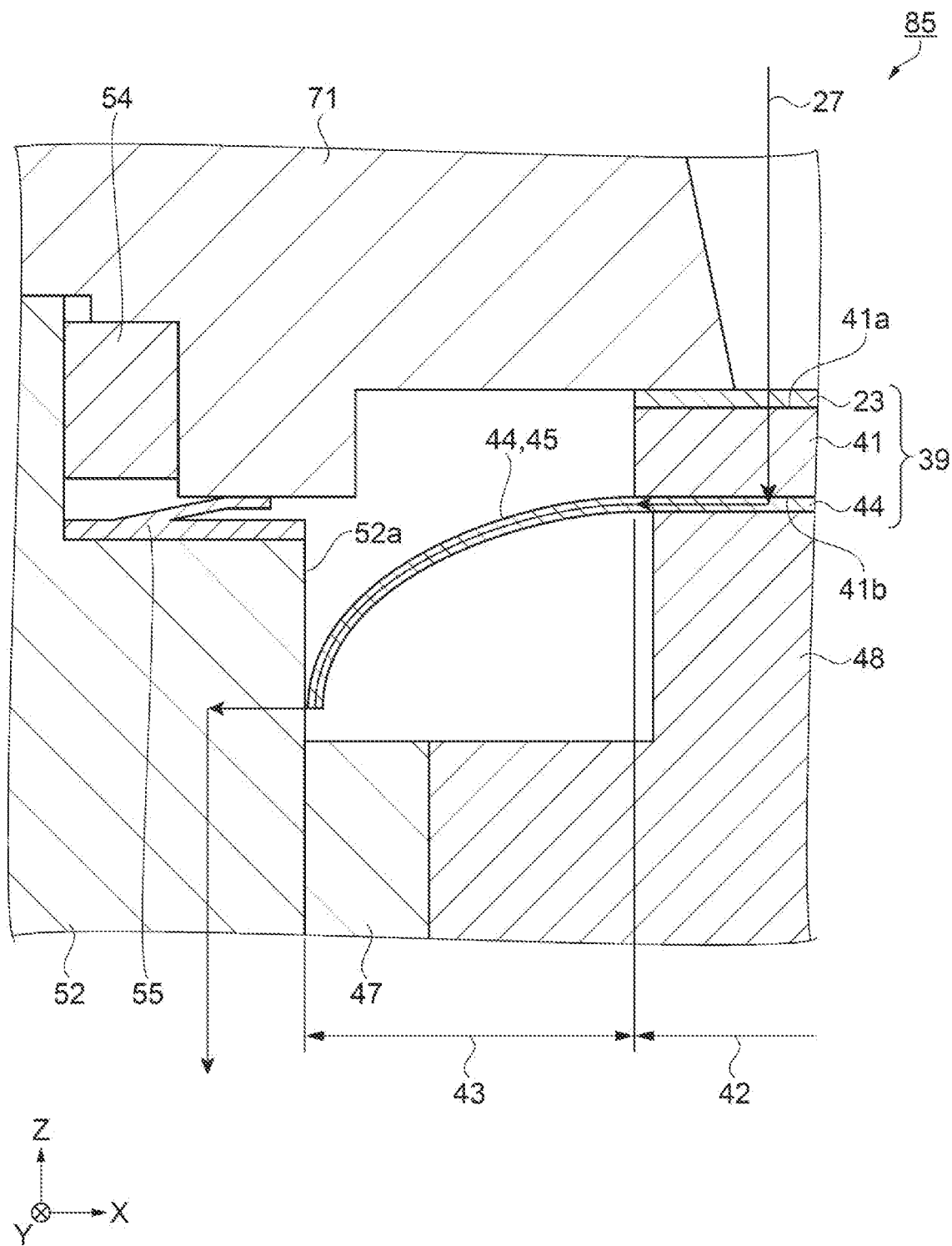
FIG. 15 is a schematic side cross-sectional view of a main part for explaining structure in which the dial and the case according to a tenth exemplary embodiment are electrically coupled.

As illustrated in FIG. 15, a watch 85 includes the dial 39 of the sixth exemplary embodiment. In the dial 39, the four leaf springs 44 are fixed to the second surface 41b of the substrate 41 by spot welding. The leaf spring 44 is the conductive portion 45 in the outer peripheral portion 43.

The watch 85 includes the case 52 of the fifth exemplary embodiment, the first member 71 of the seventh exemplary embodiment, the guide frame 47, and the movement 48. The leaf spring 44, which is the conductive portion 45, presses an inner wall 52a of the case 52. The conductive portion 45 electrically couples the outer peripheral portion 43 and the case 52. In the present exemplary embodiment, the case 52 does not include the first protruding portion 82a of the ninth exemplary embodiment.

According to this configuration, the conductive portion 45 of the outer peripheral portion 43 and the case 52 are electrically coupled. As a result, the outer peripheral portion 43 and the case 52 can be reliably electrically coupled.

The current 27 due to static electricity that enters the dial 39 enters the human body 26 through the substrate 41, the leaf spring 44, the case 52, and the case back 17. Accordingly, since the current 27 due to the static electricity does not flow into the printed wired board 15, the watch 85 has static electricity resistance.

Eleventh Exemplary Embodiment

The present embodiment differs from the fourth exemplary embodiment in that a side surface of a substrate of a dial is in contact with the case 52. Note that, configurations identical to those in the fourth exemplary embodiment will be denoted by the same reference signs and redundant descriptions will be omitted.

Figure 16:
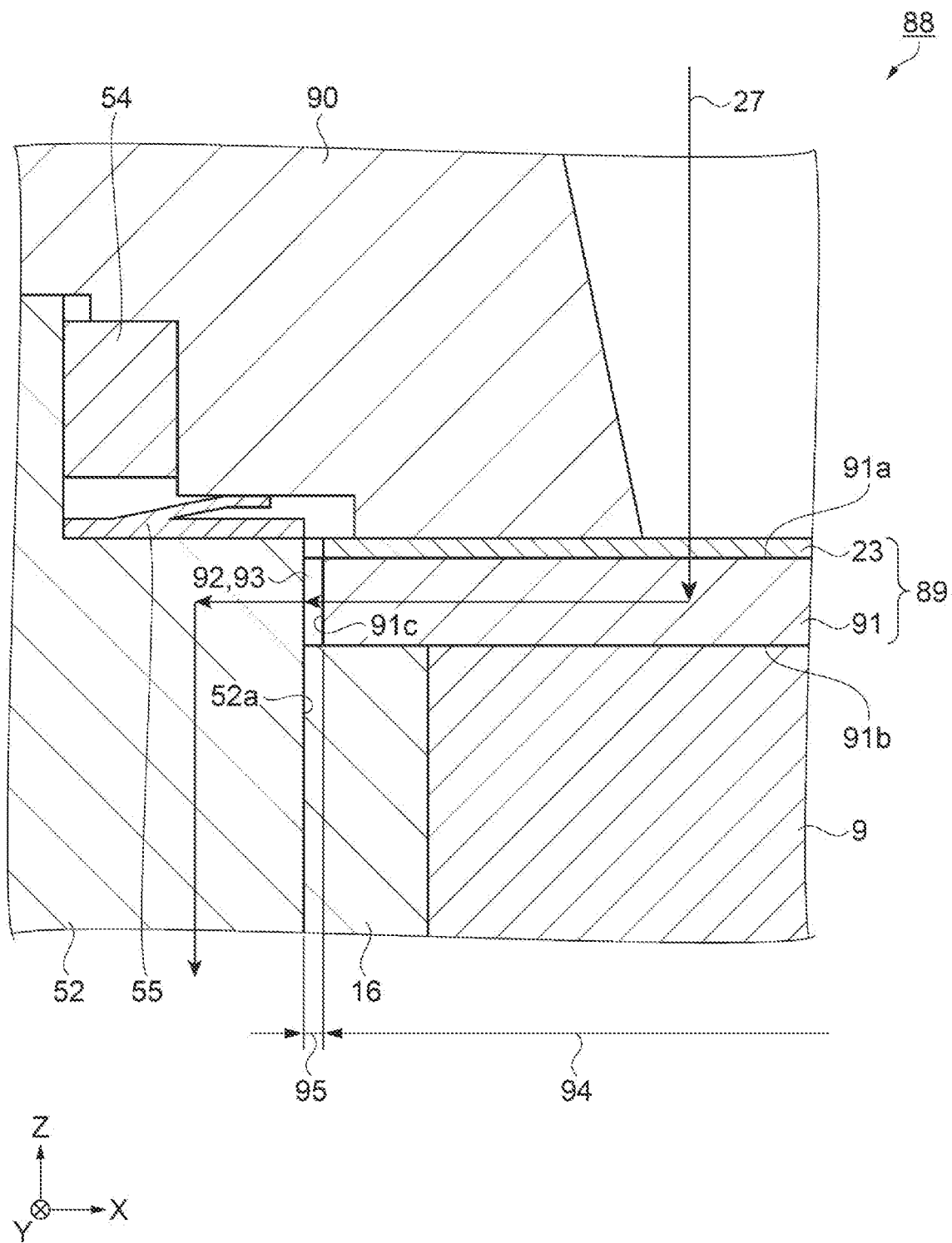
FIG. 16 is a schematic side cross-sectional view of a main part for explaining structure in which a dial and the case according to an eleventh exemplary embodiment are electrically coupled.

As illustrated in FIG. 16, a watch 88 includes a dial 89 and a first member 90. The dial 89 includes a substrate 91. An outer diameter of the substrate 91 is larger than that of the substrate 19 of the fourth exemplary embodiment. The substrate 91 includes the coating film 23 at a first surface 91a facing the windshield 2. A second surface 91b on a side opposite to the first surface 91a of the substrate 91 is in contact with the movement 9.

A metal film 92 is installed by plating on a side surface 91c of the substrate 91. The metal film 92 is a conductive portion 93. A portion where the coating film 23 is disposed in plan view of the dial 89 is a central portion 94. A portion where the metal film 92, which is the conductive portion 93, is disposed in plan view of the dial 89 is an outer peripheral portion 95.

The watch 88 includes the case 52, the first member 90, the dial 89, the guide frame 16, and the movement 9. The dial 89 fits into the inner wall 52a of the case 52. The metal film 92, which is the conductive portion 93, presses the inner wall 52a of the case 52. The conductive portion 93 electrically couples the outer peripheral portion 95 and the case 52.

According to this configuration, the conductive portion 93 of the outer peripheral portion 95 and the case 52 are electrically coupled. As a result, the outer peripheral portion 95 and the case 52 can be reliably electrically coupled.

The current 27 due to static electricity that enters the dial 89 enters the human body 26 through the substrate 91, the metal film 92, the case 52, and the case back 17. Accordingly, since the current 27 due to the static electricity does not flow into the printed wired board 15, the watch 88 has static electricity resistance.

Twelfth Exemplary Embodiment

Figure 17:
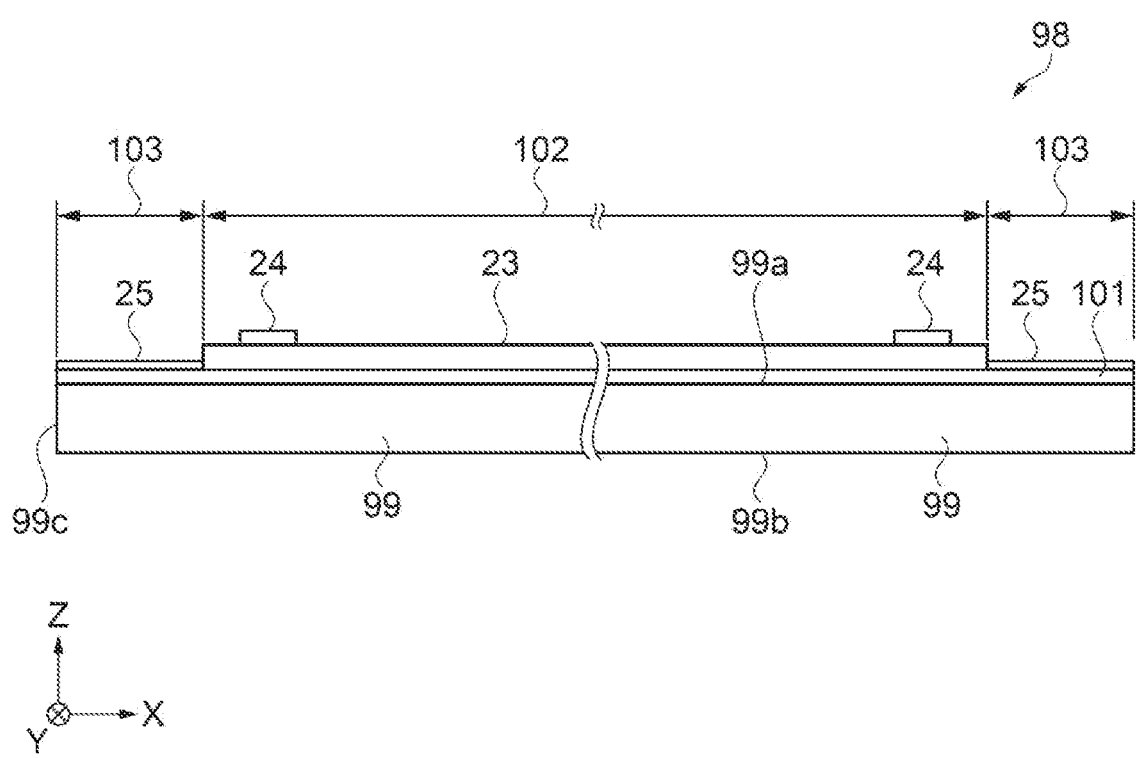
FIG. 17 is a schematic side view for explaining structure of a dial according to a twelfth exemplary embodiment.

The present exemplary embodiment differs from the first exemplary embodiment in that a substrate formed of a resin material is used rather than the metal substrate 19. As illustrated in FIG. 17, a dial 98 includes a substrate 99. A material of the substrate 99 is non-conductive. The material of the substrate 99 is not particularly limited, but various types of resin materials, ceramics, glass, and the like are used. The material of the substrate 99 is, for example, polycarbonate in the present exemplary embodiment.

A surface on the positive Z direction side of the substrate 99 is a first surface 99a. A surface on a side opposite to the first surface 99a is a second surface 99b. The substrate 99 includes a first metal film 101 that is a conductive member at the first surface 99a. As a film formation method of the first metal film 101, an electroless plating method, a sputtering method, a vapor deposition method, or the like may be adopted. The substrate 99 may include the first metal film 101 at the second surface 99b and a side surface 99c. A material of the first metal film 101 is not particularly limited, but for example in the present exemplary embodiment, the material of the first metal film 101 is nickel.

The dial 98 has a central portion 102 and an outer peripheral portion 103. The central portion 102 is provided at a center of the first surface 99a of the substrate 99 in plan view. The outer peripheral portion 103 is provided at an outer periphery of the central portion 102. The dial 98 includes the coating film 23 at the central portion 102. The dial 98 does not include the coating film 23 at the outer peripheral portion 103, and includes the metal film 25. The metal film 25 is formed by plating. The outer peripheral portion 103 has the conductive metal film 25 that is electrically coupled to the first metal film 101, and has a conductive surface. A surface of the central portion 102 is non-conductive.

The dial 98 can be applied to the dial 5 of each of the first exemplary embodiment, the second exemplary embodiment, the fourth exemplary embodiment, and the fifth exemplary embodiment. At this time, the first metal film 101 may also be installed at the second surface 99b and the side surface 99c of the substrate 99.

By installing the first metal film 101 at the second surface 99b of the substrate 99, the substrate 99 can be applied to the dial 39 of the third exemplary embodiment. In addition, the dial 98 in which the first metal film 101 is installed at the second surface 99b can be applied to the dial 39 of each of the sixth exemplary embodiment, the ninth exemplary embodiment, and the tenth exemplary embodiment. The dial 98 in which the first metal film 101 is installed at the second surface 99b can be applied to each of the dial 67 of the seventh exemplary embodiment and the dial 75 of the eighth exemplary embodiment.

When the substrate 99 is applied to the dial 39 of each of the third exemplary embodiment, the sixth exemplary embodiment, the ninth exemplary embodiment, and the tenth exemplary embodiment, the leaf spring 44 is adhesively fixed to the substrate 99. When the substrate 99 is applied to the dial 67 of the seventh exemplary embodiment, the leaf spring 44 is adhesively fixed to the substrate 99. When the substrate 99 is applied to the dial 75 of the eighth exemplary embodiment, the leaf spring 76 is adhesively fixed to the substrate 99.

By installing the first metal film 101 at the first surface 99a and the side surface 99c of the substrate 99, the substrate 99 can be applied to the dial 89 of the eleventh exemplary embodiment. In this case, the first metal film 101 may be installed at the second surface 99b and the side surface 99c of the substrate 99. Note that, in all the exemplary embodiments, the first metal film 101 may be installed at the first surface 99a, the second surface 99b, and the side surface 99c of the substrate 99. That is, the first metal film 101 may be installed at all the surfaces surrounding the substrate 99.

Thirteenth Exemplary Embodiment

In the watch 1 of the first exemplary embodiment, energy of the battery 11 is used to rotate the motor 13. The rotation of the motor 13 rotated the hour hand 6, the minute hand 7 and the seconds hand 8. In addition, the structure of each of the first exemplary embodiment to the twelfth exemplary embodiment can be applied to an optical power generation watch, a radio wave watch, a satellite radio wave watch, a spring drive watch that is an electronic controlled mechanical watch, a kinetic watch that rotates a rotational weight to generate power. At this time as well, the same effects as those of the above-described exemplary embodiments can be obtained. For a dial of an optical power generation watch, a substrate in which a metal plate and a resin plate are stacked may be used. A hole through which light passes may be provided in the central portion 21 of a metal plate.

Fourteenth Exemplary Embodiment

In the third exemplary embodiment, the four leaf springs 44 as the conductive portions 45, were installed at the substrate 41. The number of leaf springs 44 installed at the substrate 41 is not limited to four. The number of leaf springs 44 installed at the substrate 41 may be one to three, or four or more. When the number of leaf springs 44 is small, the dial 39 can be manufactured with good productivity. When the number of leaf springs 44 is large, there is a large number of contact points between the leaf spring 44 and the case 46. Therefore, it is possible to electrically couple the leaf spring 44 and the case 46 reliably. The same applies to the sixth exemplary embodiment to the tenth exemplary embodiment.

Fifteenth Exemplary Embodiment

The watch of each of the seventh exemplary embodiment to the eleventh exemplary embodiment included the case and the first member. Even when the case 3 does not include a first member as in the first exemplary embodiment, an outer peripheral portion may be electrically coupled to the case 3 as in each of the seventh exemplary embodiment to the eleventh exemplary embodiment.

Sixteenth Exemplary Embodiment

In the first exemplary embodiment, there was no sub-dial at the dial 5. When there is a sub-dial at the central portion 21 of the dial 5, the coating film 23 need not be present at the sub-dial portion. The dial 5 can be made to have a highly designed appearance.

Seventeenth Exemplary Embodiment

In the third exemplary embodiment, the leaf spring 44 and the first protruding portion 46a were in contact. The metal film 25 of the dial 5 of the first exemplary embodiment and the first protruding portion 46a may be in contact. In the sixth exemplary embodiment, the leaf spring 44 and the second protruding portion 63a were in contact. The metal film 25 of the dial 5 of the fourth exemplary embodiment and the second protruding portion 63a may be in contact. In this case as well, a contact area can be ensured.

What is claimed is:

1. A watch, comprising:
a windshield located at a top of the watch;
a dial located below the windshield, the dial including, in a plan view, a central portion having a non-conductive surface, and an outer peripheral portion provided at an outer periphery of the central portion and having a conductive surface; and
a case electrically coupled to the outer peripheral portion and electrically coupled to a case back,
wherein the windshield, the conductive surface, and the case overlap one another in the plan view.

2. The watch according to claim 1, comprising a conductive portion configured to electrically couple the outer peripheral portion and the case.

3. The watch according to claim 2,
wherein the conductive portion has elasticity.

4. The watch according to claim 1, wherein
the case includes a first protruding portion electrically coupled to the outer peripheral portion.

5. The watch according to claim 1, comprising
a first member electrically coupled to the outer peripheral portion, wherein
the first member is electrically coupled to the case.

6. The watch according to claim 5, further comprising a conductive portion configured to electrically couple the outer peripheral portion and the first member.

7. The watch according to claim 5, wherein
the first member includes a second protruding portion electrically coupled to the outer peripheral portion.

8. The watch according to claim 1, wherein
the non-conductive central portion of the dial is achieved by a coating film.

9. The watch according to claim 1, wherein
the outer peripheral portion is provided with a metal film by plating.

10. A watch comprising:
a windshield located at a top of the watch;
a dial located below the windshield, the dial including a central noon-conductive surface and an outer peripheral conductive surface in a plan view; and
a case electrically coupled to the outer peripheral conductive surface,
wherein the windshield, the conductive surface, and the case overlap one another in the plan view, and static electricity entering the dial passes through the case and flows into a case back.

\* \* \* \* \*